US012593712B2

(12) United States Patent (10) Patent No.: US 12,593,712 B2

Su et al. (45) Date of Patent: Mar. 31, 2026

(54) METHOD OF FORMING OPENING IN PASSIVATION LAYER AND STRUCTURES THEREOF

(71) Applicant: Taiwan Semiconductor Manufacturing Company, Ltd., Hsinchu (TW)

(72) Inventors: Chung-Hao Su, Hsinchu City (TW); Wen-Chiung Tu, New Taipei City (TW); Hsing-Hsiang Wang, Hsinchu (TW); Chen-Chiu Huang, Taichung City (TW); Hsiang-Ku Shen, Hsinchu City (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 375 days.

(21) Appl. No.: 18/322,329

(22) Filed: May 23, 2023

(65) Prior Publication Data

US 2024/0395741 A1 Nov. 28, 2024

(51) Int. Cl.
H01L 23/00 (2006.01)

(52) U.S. Cl.
CPC .............. H01L 24/03 (2013.01); H01L 24/05 (2013.01); H01L 24/11 (2013.01); *H01L 2224/02331* (2013.01); *H01L 2224/03466* (2013.01); *H01L 2224/03916* (2013.01); *H01L 2224/05546* (2013.01); *H01L 2224/11* (2013.01)

(58) Field of Classification Search
CPC ......... H01L 24/03; H01L 24/05; H01L 24/11; H01L 2224/02331; H01L 2224/03466; H01L 2224/03916; H01L 2224/05546; H01L 2224/11; H01L 24/13
See application file for complete search history.

(56) References Cited

U.S. PATENT DOCUMENTS

| | | | |
|---|---|---|---|
| 6,689,680 B2 * | 2/2004 | Greer ...................... | H01L 24/11 |
| | | | 438/615 |
| 6,713,381 B2 * | 3/2004 | Barr .................. | H01L 21/76801 |
| | | | 257/E21.585 |
| 6,803,327 B1 | 10/2004 | Cheu et al. | |
| 7,494,928 B2 | 2/2009 | Lu et al. | |
| 8,581,389 B2 | 11/2013 | Chen et al. | |
| 8,716,858 B2 | 5/2014 | Lu et al. | |
| 9,337,133 B2 | 5/2016 | Chen | |

(Continued)

*Primary Examiner* — Leonardo Andujar

(74) *Attorney, Agent, or Firm* — Haynes and Boone, LLP

(57) ABSTRACT

A semiconductor device and method including depositing a passivation layer over an upper contact feature. In some embodiments, a polyimide (PI) layer is formed over the passivation layer. In an example, the PI layer is patterned to form a patterned PI layer including a first opening that exposes a portion of the passivation layer over the upper contact feature. In an embodiment, one or more etching processes are performed to form a second opening that exposes a top surface of the upper contact feature. In some embodiments, the one or more etching processes etches the passivation layer through the first opening to form a patterned passivation layer. In some examples, the one or more etching processes also recesses sidewall surfaces of the patterned PI layer from corners of the patterned passivation layer defined along opposing surfaces of the second opening.

20 Claims, 9 Drawing Sheets

200

(56) References Cited

U.S. PATENT DOCUMENTS

| | | | |
|---|---|---|---|
| 11,018,100 | B2 | 5/2021 | Shih et al. |
| 11,417,610 | B2 | 8/2022 | Chen et al. |
| 11,688,633 | B2 | 6/2023 | Chen et al. |
| 2007/0166992 | A1* | 7/2007 | Daubenspeck ......... H01L 24/13 |
| | | | 257/E23.01 |
| 2015/0102487 | A1 | 4/2015 | Wang |
| 2016/0005702 | A1 | 1/2016 | Shih |
| 2016/0204001 | A1 | 7/2016 | Lee |

* cited by examiner

METHOD OF FORMING OPENING IN PASSIVATION LAYER AND STRUCTURES THEREOF

BACKGROUND

The electronics industry has experienced an ever-increasing demand for smaller and faster semiconductor devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

By way of example, as part of a back-end-of-line (BEOL) process, one or more passivation layers may be formed over a semiconductor substrate including a device layer (e.g., transistors, etc.) and a multi-layer interconnect (MLI) structure which provides interconnections between various microelectronic components within the substrate. In some embodiments, contact vias may be formed to electrically couple lower contact features to upper contact features, such as contact pads, for connection to external circuitry. In various examples, a polyimide (PI) layer formed over the one or more passivation layers may experience stress at corner interfaces between the PI layer and an underlying passivation layer, which may result in cracks in the PI layer, thereby degrading device reliability.

Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
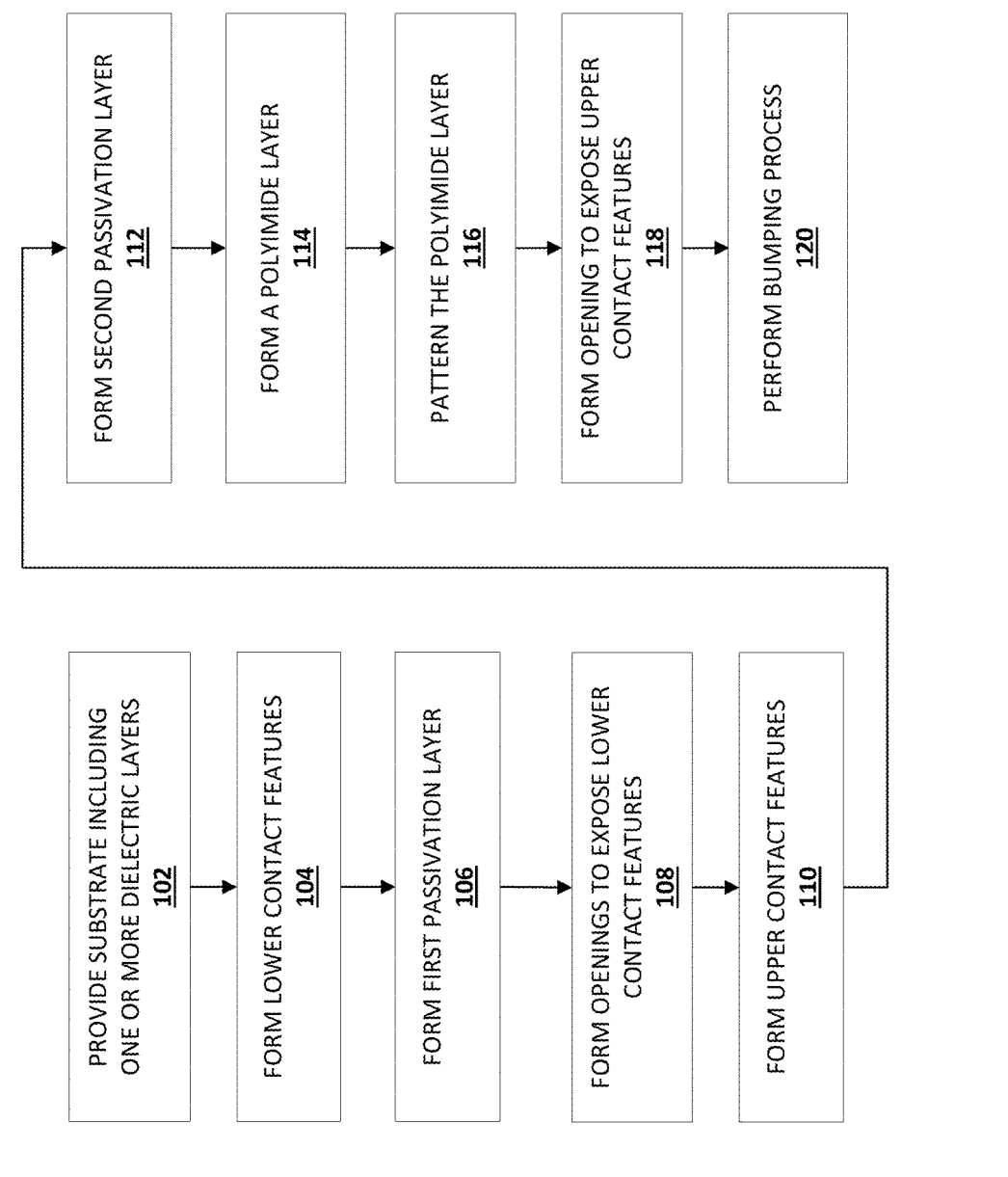
FIG. 1 is a flow chart of a method of forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

In various embodiments, and as part of a back-end-of-line (BEOL) process, one or more passivation layers may be formed over a semiconductor substrate including a device layer (e.g., transistors, etc.) and a multi-layer interconnect (MLI) structure which provides interconnections between various microelectronic components within the substrate. In some embodiments, contact vias may be formed to electrically couple lower contact features to upper contact features, such as contact pads, for connection to external circuitry. In various examples, openings are formed in a passivation layer to expose a surface of the upper contact features for electrical connection thereto. After formation of the openings in the passivation layer, a polyimide (PI) layer may be formed and patterned. However, in some cases, stress at corner interfaces between the passivation layer and the PI layer may result in cracks in the PI layer, thereby degrading device reliability. Thus, existing methods have not been entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for enhancing the reliability of a patterned PI layer formed over one or more passivation layers as part of a BEOL process. The disclosed embodiments also provide a simplified process for forming the patterned PI layer at a reduced cost (e.g., by reducing the number of masks used for device processing). In particular, in various embodiments, the patterning of the PI layer and the underlying passivation layer (e.g., to form a via that exposes a surface of an upper contact feature) may be performed using a single photolithography step (e.g., a single mask). Moreover, in contrast to existing implementations, no portion of the PI layer will remain within the via formed in the underlying passivation layer, or at corners of the via opening. As a result, stress at corner interfaces between the passivation layer and the PI layer, as well as any potential cracks in the PI layer resulting therefrom, can be avoided. Additional details of embodiments of the present disclosure are provided below, and additional benefits and/or other advantages will become apparent to those skilled in the art having benefit of the present disclosure.

Referring now to FIG. 1, illustrated is a method 100 of forming semiconductor device, in accordance with some embodiments. The method 100 is described below in more detail with reference to FIGS. 2-9, which provide cross-sectional views of a semiconductor device 200 at different stages of fabrication, according to embodiments of the present disclosure. It will be understood that the method 100 is merely an example and is not intended to limit the present disclosure to what is explicitly illustrated in the method 100. Further, additional process steps may be implemented before, during, and after the method 100, and some process steps described may be replaced or eliminated in accordance with various embodiments of the method 100. It is also noted that for clarity of discussion, not all steps are described herein in detail. In addition, parts of the method 100 may be fabricated by a well-known complementary metal-oxide-semiconductor (CMOS) technology process flow, and thus some processes are only briefly described herein.

Figure 2:
FIGS. 2, 3, 4, 5, 6, 7, 8, and 9 provide cross-sectional views of a device at intermediate stages of fabrication and processed in accordance with the method of FIG. 1, according to some embodiments.
Figure 2:
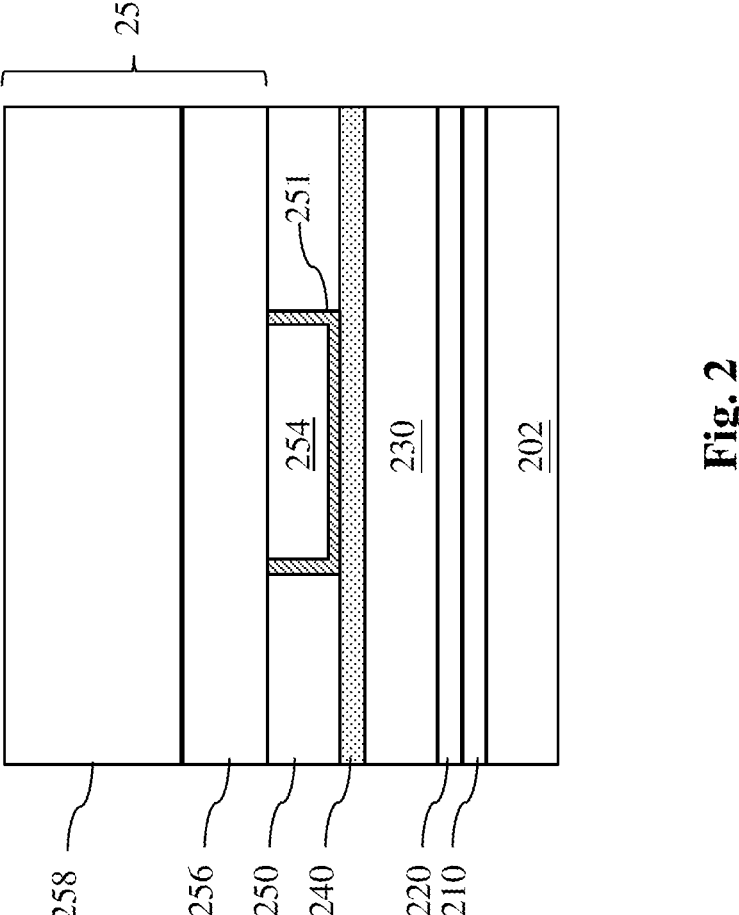

The method 100 begins at block 102 where a substrate including one or more dielectric layers is provided. With reference to FIG. 2, and in an embodiment of block 102, a device 200 including a substrate 202 is provided. The substrate 202 may be a semiconductor substrate such as a silicon substrate. The substrate 202 may include various layers, including conductive or insulating layers formed on the substrate 202. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, in some embodiments, the substrate 202 may include an epitaxial layer (epi-layer), the substrate 202 may be strained for performance enhancement, the substrate 202 may include a silicon-on-insulator (SOI) structure, and/or the substrate 202 may have other suitable enhancement features.

In some embodiments, the substrate 202 includes one or more active and/or passive semiconductor devices such as transistors, diodes, optoelectronic devices, resistors, capacitors, sensors, or other devices. In various examples, the transistors may include source/drain features, gate structures, gate spacers, contact features, isolation structures such as shallow trench isolation (STI) structures, or other suitable components. By way of example, the active and/or passive semiconductor devices formed within the substrate 202 may be formed as part of a front-end-of-line (FEOL) process.

In various examples, the substrate 202 may also include an interconnect structure such as a multi-layer interconnect (MLI) structure, which may include multiple patterned dielectric layers and conductive layers that provide interconnections (e.g., wiring) between the various microelectronic components formed within the substrate 202. By way of example, the MLI structure, as well as other layers, features, components, or devices formed over the MLI structure may be formed as part of a BEOL process. In addition, and in at least some cases, one or more of the dielectric layers and/or conductive layers of the MLI structure may be formed over the substrate 202. As noted, the interconnect structure may include a plurality of conductive features and a plurality of dielectric features used to provide isolation between the conductive features. In some embodiments, the conductive features may include contacts, vias, or metal lines to provide horizontal and vertical interconnections. In some cases, the metal lines may include copper (Cu), aluminum (Al), an aluminum copper (AlCu) alloy, ruthenium (Ru), cobalt (Co), or other appropriate metal layer. In some examples, the contacts and/or vias may include Cu, Al, an AlCu alloy, Ru, Co, tungsten (W), or other appropriate metal layer. In some embodiments, the dielectric features of the MLI structure may include silicon oxide or a silicon oxide containing material where silicon exists in various suitable forms. In some examples, the dielectric features may include a low-k dielectric layer (e.g., having a dielectric constant less than that of $SiO_2$ which is about 3.9) such as tetraethylorthosilicate (TEOS) oxide, undoped silicate glass (USG), or doped silicon oxide such as borophosphosilicate glass (BPSG), fluorosilicate glass (FSG), phosphosilicate glass (PSG), boron doped silicon glass (BSG), and/or other suitable low-k dielectric material.

In some embodiments, and in a further embodiment of block 102, an interlayer dielectric (ILD) 210 is formed over the substrate 202. The ILD 210 may include silicon oxide, a silicon oxide containing material, or a low-k dielectric layer such as TEOS oxide, undoped silicate glass (USG), or doped silicon oxide such as BPSG, FSG, PSG, BSG, and/or other suitable low-k dielectric material. In various examples, the ILD 210 may be deposited by chemical vapor deposition (CVD), physical vapor deposition (PVD), atomic layer deposition (ALD), or combinations thereof. As one example, the ILD 210 may have a thickness of about 200 nm. In other embodiments, the ILD 210 may have a thickness of between about 150 nm and about 250 nm. The ILD 210 may be conformally deposited and have a substantially uniform thickness.

In some examples, and in a further embodiment of block 102, a carbide layer 220 is formed over the ILD 210. In some embodiments, the carbide layer 220 may be deposited by CVD. PVD, ALD, or combinations thereof. In some embodiments, the carbide layer 220 may include a silicon carbide (SiC) layer, although other types of carbide materials may be used. In some examples, the carbide layer 220 may have a thickness of about 55 nm. In other embodiments, the carbide layer 220 may have a thickness of between about 45 nm and about 65 nm. The carbide layer 220, in some embodiments, may be conformally deposited and have a substantially uniform thickness.

Still referring to FIG. 2, and in a further embodiment of block 102, the device 200 further includes a dielectric layer 230 formed over the carbide layer 220. In some embodiments, the dielectric layer 230 may include silicon oxide or a silicon oxide containing material. In some cases, the dielectric layer 230 may include undoped silicate glass (USG). In various examples, the dielectric layer 230 may be deposited by plasma enhanced CVD (PECVD), high-density plasma CVD (HDP-CVD), sub-atmospheric CVD (SACVD), ALD, PVD, or a combination thereof. In some cases, the dielectric layer 230 may have a thickness of about 620 nm. In other embodiments, the dielectric layer 230 may have a thickness of between about 575 nm and about 675 nm. In some embodiments, the dielectric layer 230 may be conformally deposited and have a substantially uniform thickness.

In some embodiments, and in a further embodiment of block 102, a dielectric layer 240 may be formed over the dielectric layer 230. In some cases, the dielectric layer 240 may include a nitrogen-containing material and/or a carbon-containing material. For example, the dielectric layer 240 may include silicon carbon nitride (SiCN), silicon oxycarbide (SiOC), silicon carbide (SiC), silicon oxycarbonitride (SiOCN), silicon nitride (SiN), or combinations thereof. In some embodiments, the dielectric layer 240 may have a thickness of about 50 nm. In other embodiments, the dielectric layer 240 may have a thickness of between about 45 nm and about 55 nm. In various examples, the dielectric layer 240 may be deposited by CVD, ALD, PVD, or combinations thereof. The dielectric layer 240 may, in some cases, function as an etch stop layer (ESL).

The method 100 proceeds to block 104 where lower contact features are formed. Still with reference to FIG. 2, and in an embodiment of block 104, a dielectric layer 250 may be deposited over the dielectric layer 240. In some embodiments, the dielectric layer 250 includes silicon oxide or a silicon oxide containing material. In some cases, the dielectric layer 250 may include undoped silicate glass (USG). In various examples, the dielectric layer 250 may be deposited by PECVD, HDP-CVD, SACVD, ALD, PVD, or a combination thereof. In some cases, the dielectric layer 250 may have a thickness of about 900 nm. In other embodiments, the dielectric layer 250 may have a thickness of between about 800 nm and about 1000 nm. In some embodiments, the dielectric layer 250 may be conformally deposited and have a substantially uniform thickness.

After deposition of the dielectric layer 250, and in a further embodiment of block 104, the dielectric layer 250 may be patterned to form trenches. In various examples, the dielectric layer 250 may be patterned using a suitable combination of photolithography processes (e.g., such as photoresist deposition, exposure, and development) to form an etch mask, and an etching process may be performed using the etch mask to form the trenches. In some cases, a hard mask layer (e.g., such as a nitride-containing layer) may be used as part of the patterning process of the dielectric layer 250.

In some embodiments, and in a further embodiment of block 104, a lower contact feature 254 is formed in a trench provided by the patterning of the dielectric layer 250. It will be understood that other lower contact features may likewise be formed in other trenches provided by the patterning of the dielectric layer 250. Although the lower contact feature 254 is disposed below an upper contact feature (discussed below), the lower contact feature 254, as well as any other lower contact features, are sometimes referred to as top metal (TM) contacts because they represent a top metal layer of the MLI structure, previously discussed. In some embodiments, the lower contact feature 254 may include a barrier layer 251 and a metal fill layer to complete the lower contact feature 254. By way of example, formation of the lower contact feature 254 includes multiple processes. In some embodiments, the barrier layer 251 is formed in each of the trenches provided by the patterning of the dielectric layer 250, followed by the deposition of a metal fill layer over the barrier layer 251. In some embodiments, the barrier layer 251 includes titanium nitride, tantalum, tantalum nitride, or combinations thereof. In some embodiments, the metal fill layer includes a metal or metal alloy such as copper, cobalt, nickel, aluminum, tungsten, titanium, or combinations thereof. In some embodiments, the metal fill layer is formed by deposition or plating, followed by a chemical mechanical planarization (CMP) process.

After forming the lower contact feature 254, the method 100 proceeds to block 106 where a first passivation layer is formed. As shown in FIG. 2, and in an embodiment of block 106, a first passivation layer 252 is formed over device 200 including over the lower contact feature 254. In some embodiments, the first passivation layer 252 includes a dielectric layer 256 formed over the lower contact feature 254. In some embodiments, the dielectric layer 256 is about 75 nm thick. In other embodiments, the dielectric layer 256 may have a thickness of between about 65 nm and about 85 nm. The dielectric layer 256 may include a nitrogen-containing material and/or a carbon-containing material. For example, the dielectric layer 256 may include SiCN, SiOC, SiC, SiOCN, SiN, or combinations thereof. In various examples, the dielectric layer 256 may be deposited by CVD, ALD, PVD, or combinations thereof. In some embodiments, the dielectric layer 256 may protect the lower contact feature 254 from being oxidized.

The first passivation layer 252 may further include a dielectric layer 258 formed over the dielectric layer 256. In some embodiments, the dielectric layer 258 may include silicon oxide or a silicon oxide containing material. In some cases, the dielectric layer 258 may include undoped silicate glass (USG). The dielectric layer 258 may be deposited by PECVD, HDP-CVD, SACVD, ALD, PVD, or a combination thereof. Thus, in some cases, the dielectric layer 258 may be referred to as a plasma-enhanced oxide (PEOX). In some cases, the dielectric layer 258 may have a thickness of about 750 nm. In other embodiments, the dielectric layer 258 may have a thickness of between about 600 nm and about 1000 nm. In at least some embodiments, the first passivation layer 252 may only include the dielectric layer 256, and not the dielectric layer 258.

Figure 3:
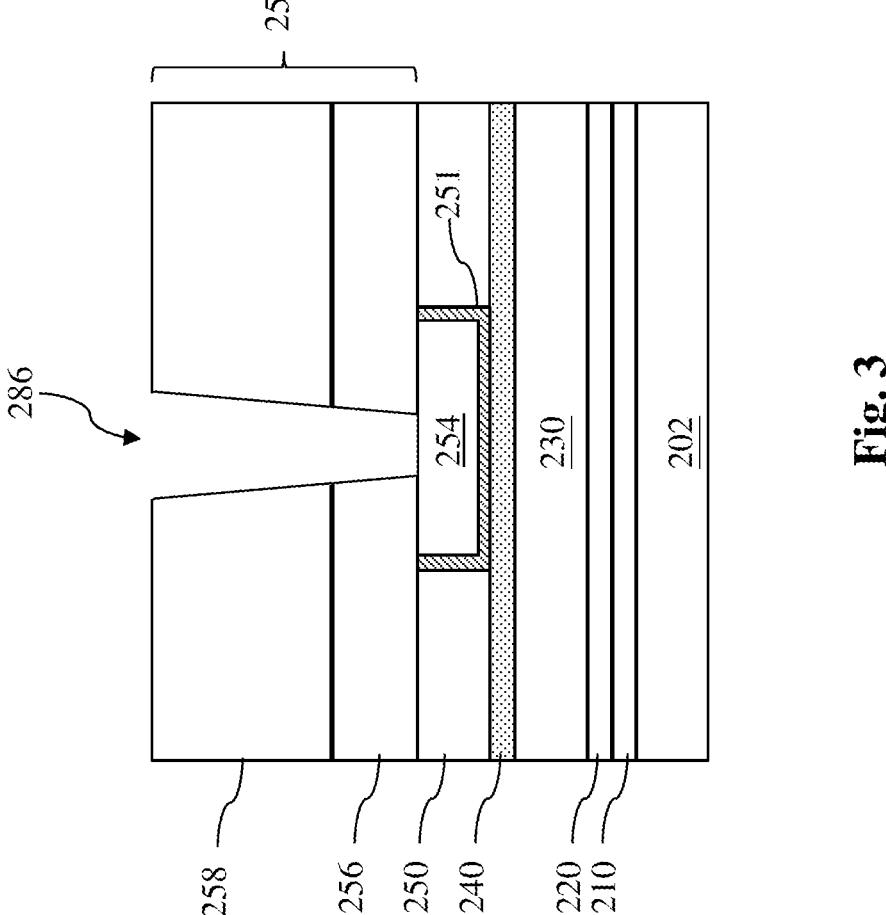
Figure 3:
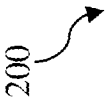

After formation of the first passivation layer 252, the method 100 proceeds to block 108 where openings are formed to expose the lower contact features. As shown in FIG. 3, and in an embodiment of block 108, an opening 286 is formed. The opening 286 may penetrate through the first passivation layer 252, including the dielectric layer 258 and the dielectric layer 256, to expose a top surface of the lower contact feature 254. In some embodiments, the opening 286 may be formed using an etching process (e.g., such as a dry etching process, a wet etching process, or a combination thereof). In various embodiments, sidewalls of the opening 286 may expose sidewalls of the various layers through which the opening 286 penetrates. In some cases, for example when the first passivation does not include the dielectric layer 258, the opening may simply penetrate through the dielectric layer 256 to expose the top surface of the lower contact feature 254.

Figure 4:
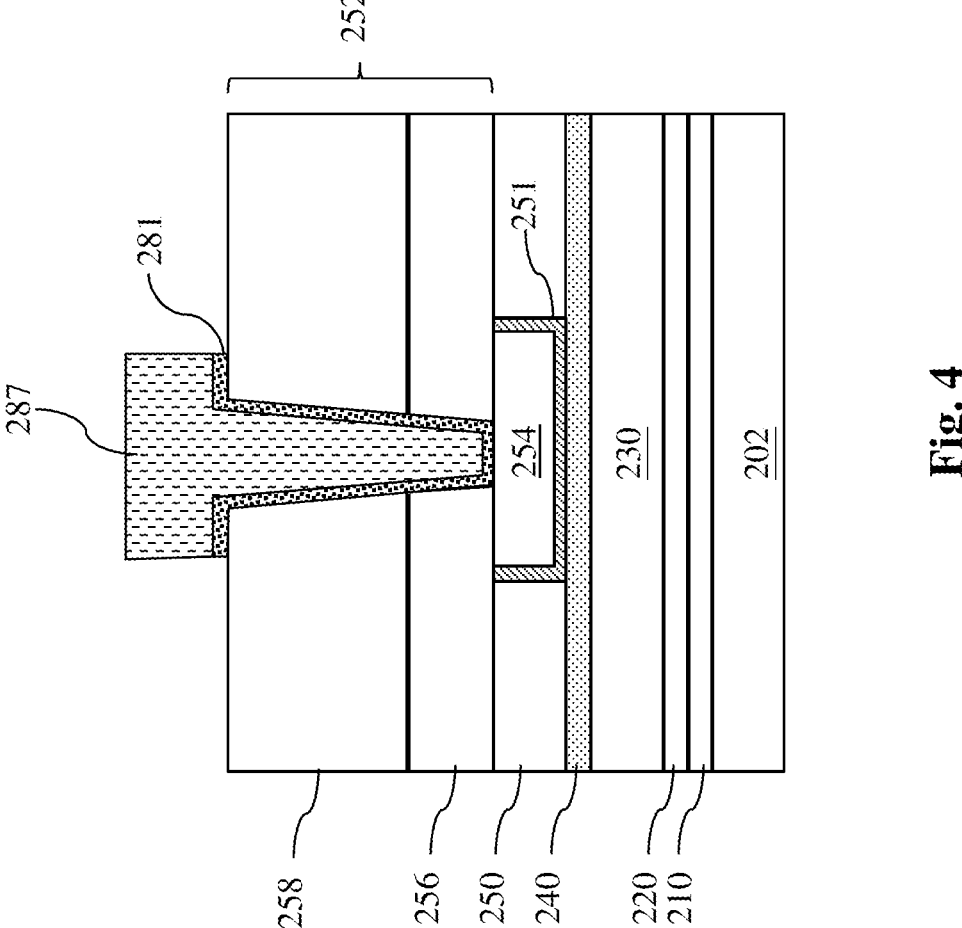
Figure 4:
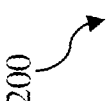

The method 100 then proceeds to block 110 where upper contact features are formed. With reference to FIG. 4, and in an embodiment of block 110, an upper contact feature 287 is formed in and over the opening 286. The upper contact feature 287 includes contact vias that fill the opening 286 and may be referred to as contact vias, metal vias, or metal lines. In some embodiments, to form the upper contact feature 287, a barrier layer 281 is first conformally deposited over the first passivation layer 252 and into the opening 286 using a suitable deposition technique, such as ALD, PVD, or CVD, and then a metal fill layer is deposited over the barrier layer 281 using a suitable deposition technique, such as ALD, PVD, or CVD. The deposited barrier layer 281 and the metal fill layer are then patterned to form the upper contact feature 287, as illustrated in the example in FIG. 4. In some cases, the contact feature 287, as well as similarly formed contact features, may be referred to as contact pads. In some embodiments, the barrier layer 281 and the metal fill layer are patterned in a two-stage or multiple-stage etch process. In the example of FIG. 4, portions of the upper contact feature 287 that extend above the first passivation layer 252 have substantially straight sidewalls. However, in some alternative embodiments, portions of the upper contact feature 287 that extend above the first passivation layer 252 may have tapered sidewalls.

In some embodiments, an upper portion of the upper contact feature 287, as well as other similar contact features, are part of a redistribution layer (RDL) that includes various metal lines used to redistribute bonding pads to different locations, such as from peripheral locations to being uniformly distributed on a chip surface. In various examples, the RDL couples the multi-layer interconnect (MLI) structure to the bonding pads, for connection to external circuitry. Further, upper contact features (e.g., such as the upper contact feature 287) provide electrical contact to lower contact features (e.g., such as the lower contact feature 254).

Figure 5:
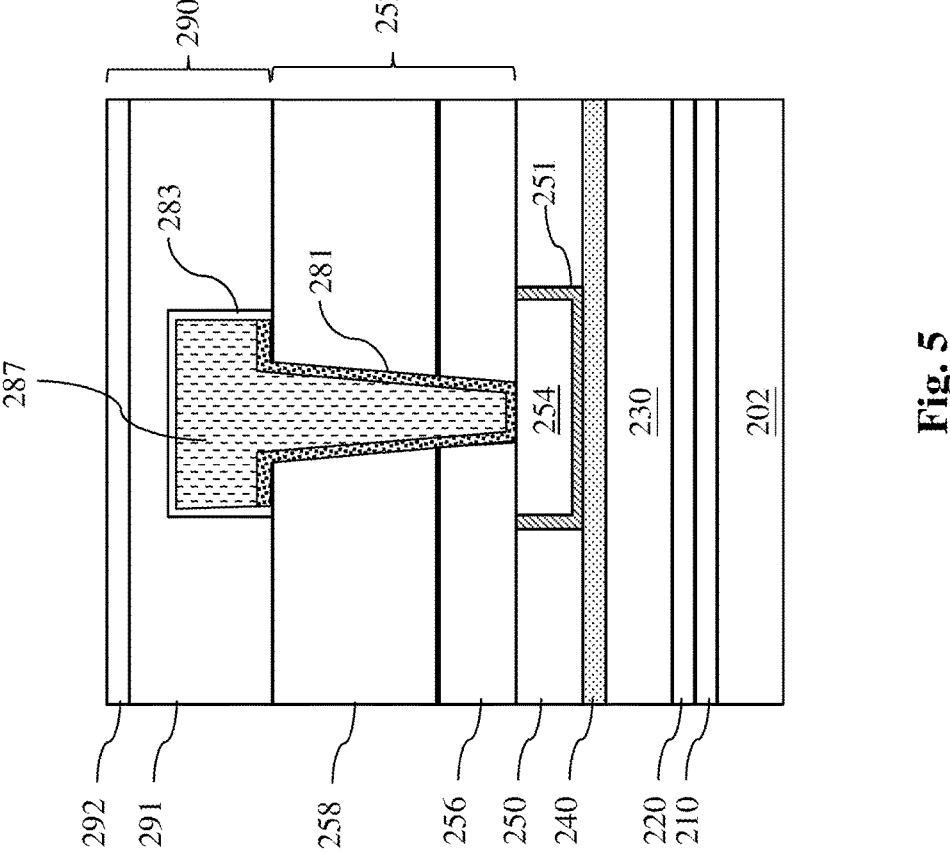
Figure 5:

The method 100 proceeds to block 112 where a second passivation layer is formed. Referring to FIG. 5, and in an embodiment of block 112, a second passivation layer 290 is formed over device 200 including over the upper contact feature 287 and over the first passivation layer 252. In some embodiments, the second passivation layer 290 includes a dielectric layer 291 formed over the upper contact feature 287 and over the first passivation layer 252. In some embodiments, the dielectric layer 291 may include silicon oxide or a silicon oxide containing material. In some cases, the dielectric layer 291 may include undoped silicate glass (USG). The dielectric layer 291 may be deposited by PECVD, HDP-CVD, SACVD, ALD, PVD, or a combination thereof. Thus, in some cases, the dielectric layer 291 may be referred to as a plasma-enhanced oxide (PEOX). In some cases, the dielectric layer 291 may have a thickness of about 900 nm. In other embodiments, the dielectric layer 291 may have a thickness of between about 800 nm and about 1000 nm. In some cases, as part of the second passivation layer 290 and prior to depositing the dielectric layer 291, a dielectric layer 283 may be formed over the portions of the upper contact feature 287 disposed above the first passivation layer 252, as shown in FIG. 5. In some embodiments, the dielectric layer 283 is about 200 nm thick. In other embodiments, the dielectric layer 283 may have a thickness of between about 75 nm and about 300 nm. The dielectric layer 283 may include a nitrogen-containing material and/or a carbon-containing material. For example, the dielectric layer 283 may include SiCN, SiOC, SiC, SiOCN, SiN, or combinations thereof. In various examples, the dielectric layer 283 may be deposited by CVD, ALD, PVD, or combinations thereof. In some embodiments, the dielectric layer 283 serves as a barrier layer and may protect the upper contact feature 287 from being oxidized. In some examples, the second passivation layer 290 further includes a dielectric layer 292 formed over the dielectric layer 291. In some embodiments, the dielectric layer 292 is about 800 nm thick. In other embodiments, the dielectric layer 292 may have a thickness of between about 700 nm and about 900 nm. The dielectric layer 292 may include a nitrogen-containing material and/or a carbon-containing material. For example, the dielectric layer 292 may include SiCN, SiOC, SiC, SiOCN, SiN, or combinations thereof. In various examples, the dielectric layer 292 may be deposited by CVD, ALD, PVD, or combinations thereof.

Figure 6:
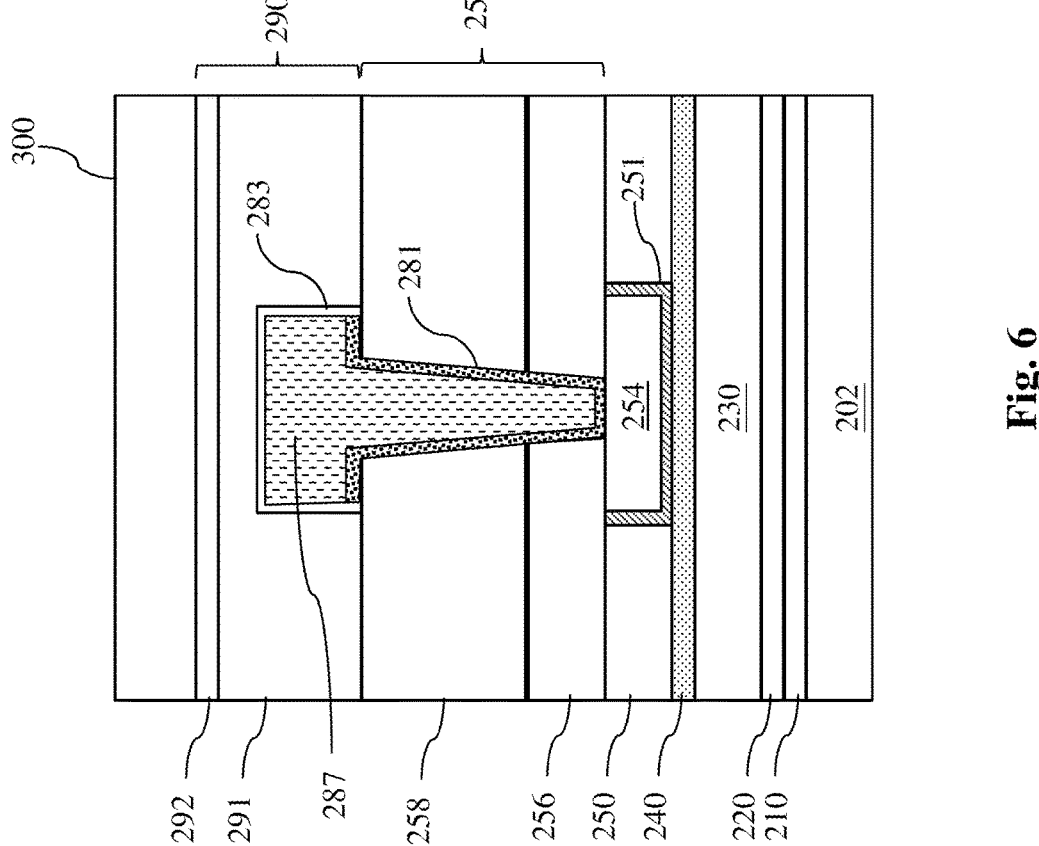
Figure 6:

The method 100 proceeds to block 114 where a polyimide (PI) layer is formed. With reference to FIG. 6, in an embodiment of block 114, a PI layer 300 is deposited over the dielectric layer 292 using a suitable deposition technique, such as spin-coating or a vapor-deposition process (VDP). The PI layer 300 may include a photosensitive material (e.g., a photo-active agent), such that the PI layer 300 includes as a negative-tone or positive-tone photosensitive PI layer. For purposes of this discussion, the PI layer 300 includes a negative-tone photosensitive PI layer 300. To be sure, in at least some embodiments, the PI layer 300 may be non-photosensitive. In some examples, the PI layer 300 may have a thickness of between about 2.2 μm and about 5 μm. In some embodiments, a baking (or curing) process may be performed after deposition of the PI layer 300. Formation of the PI layer 300, as shown and described herein, may be in contrast to at least some existing implementations where openings which expose the upper contact features are formed prior to deposition of the PI layer 300. By depositing (and subsequently patterning) the PI layer 300 first, the process can be simplified and the cost reduced (e.g., by reducing the number of masks used for processing), as described further below.

Figure 7:
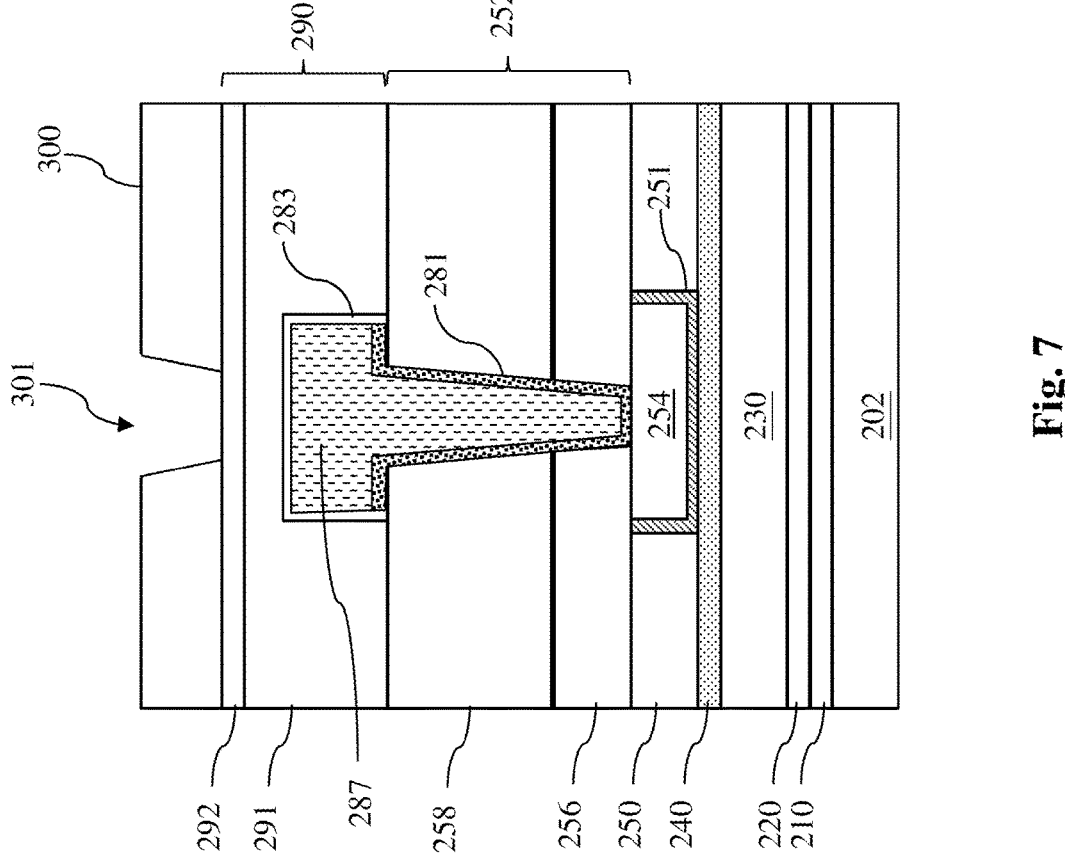
Figure 7:

After formation of the PI layer 300, the method 100 proceeds to block 116 where the PI layer is patterned. With reference to FIG. 7, in an embodiment of block 116, the PI layer 300 is patterned to form an opening 301 that exposes the dielectric layer 292 of the second passivation layer 290. In some embodiments, since the PI layer 300 is photosensitive, the PI layer 300 may be patterned using suitable photolithography processes (e.g., such as an exposure process and a development process), without a subsequent etching process. However, in other embodiments where the PI layer 300 is non-photosensitive, the PI layer 300 may be patterned using another suitable combination of photolithography processes (e.g., such as photoresist deposition, exposure, and development) to form an etch mask, and an etching process may then be performed using the etch mask to form the opening 301.

Figures 8, 8A:
FIG. 8A illustrates an enlarged view of a portion of the device of FIG. 8, according to some embodiments.

The method 100 proceeds to block 118 where openings are formed to expose the upper contact features. As shown in FIG. 8, and in an embodiment of block 118, an opening 302 is formed. Formation of the opening 302 may, in some examples, be referred to as enlarging or expanding the opening 301, discussed above. In some embodiments, the opening 302 may penetrate through, from top to bottom, the PI layer 300, the dielectric layer 292, the dielectric layer 291, and the dielectric layer 283 to expose a top surface of the upper contact feature 287, where sidewalls of the opening 302 expose sidewalls of the various layers through which the opening 302 penetrates. In various embodiments, the opening 302 may define a via opening that exposes the top surface of the upper contact feature 287, where an upper portion of the via opening is defined by the patterned PI layer 300 and where a lower portion of the via opening is defined by the patterned second passivation layer 290 (e.g., the patterned dielectric layers 292, 291, 283). In the example of FIG. 8 and as more clearly illustrated in FIG. 8A (which shows an enlarged view of a portion 317 of the device 200 that includes the opening 302), each of the upper and lower portions of the via opening have tapered sidewalls, where a top width 'W1' of the upper portion is greater than a bottom width 'W2' of the upper portion, and where a top width 'W3' of the lower portion is greater than a bottom width 'W4' of the lower portion. In some alternative embodiments, however, one or both of the upper and lower portions of the via opening may have substantially straight sidewalls.

It is noted that as a result of patterning the PI layer 300 (block 116) prior to forming the opening 302, none of the PI layer 300 remains within the lower portion of the via opening defined by the patterned second passivation layer 290. Stated another way, the lower portion of the via opening is free of a material used to form the PI layer 300. In various embodiments, formation of the opening 302 may cause sidewall surfaces 310 of the patterned PI layer 300 within the upper portion of the via opening to be recessed from corners 312 (of the patterned second passivation layer 290 within the lower portion of the via opening) defined along opposing surfaces of the opening 302, by a distance 'D', such that the corners 312 are fully exposed. In some embodiments, the distance 'D' is greater than about 600 nm. Stated another way, the recessing of the sidewall surfaces 310 of the patterned PI layer 300 by the distance 'D' will result in the composite via opening (e.g., including both upper and lower portions) having a jog pattern, such that the bottom width 'W2' of the upper portion of the via opening is greater than the top width 'W3' of the lower portion of the via opening. Thus, in some examples, it may be said that the jog pattern has a width that is greater than about 600 nm. In cases where each of the upper and lower portions of the via opening have substantially straight sidewalls, it may be simply said that a width of the upper portion of the via opening is greater than a width of the lower portion of the via opening. By ensuring that there is no overlap of the patterned PI layer 300 over the corners 312, potential stress at the corners 312, as well as any potential cracks in the patterned PI layer 300 resulting from such stress, can be avoided.

In some embodiments, the opening 302 may be formed using an etching process such as a dry etching process, a wet etching process, or a combination thereof. In some cases, the etching process used to form the opening 302 etches down through the second passivation layer 290 (e.g., the dielectric layers 292, 291, 283) exposed by prior formation of the opening 301, while simultaneously etching laterally to recess the sidewall surfaces 310 of the patterned PI layer 300 from the corners 312 by the distance 'D'. In other embodiments, a dry etching process and a wet etching process may be performed sequentially to form the opening 302. For example, in some cases, a dry etching process may first be performed to etch down through the second passivation layer 290 (e.g., the dielectric layers 292, 291, 283) using the previously patterned PI layer 300 as an etch mask, and then a wet etching process may be performed to recess the sidewall surfaces 310 of the patterned PI layer 300 from the corners 312 by the distance 'D'. In some cases, an etch chemistry for a dry etching process used in the formation of the opening 302 includes $CF_4$, $NF_3$, Ar, $O_2$, a combination thereof, and/or other suitable etch chemistries. In some embodiments, an etch chemistry for a wet etching process used in the formation of the opening 302 includes ST250, dilute hydrofluoric acid (dHF), a combination thereof, and/or other suitable etch chemistries. While some examples of etching processes and etch chemistries used to form the opening 302 have been given, it will be understood that other and/or additional processes and additional etch chemistries may be used without departing from the scope of the present disclosure. Further, regardless of the exact etching processes or etch chemistries used to form the opening 302, it is noted that the disclosed embodiments provide for formation of the opening 302 using a single mask, which simplifies device processing and reduces cost. Specifically, a mask may be used to pattern the PI layer at block 116 to form the opening 301, while an additional mask is not needed form further form the opening 302 at block 118.

Figure 9:
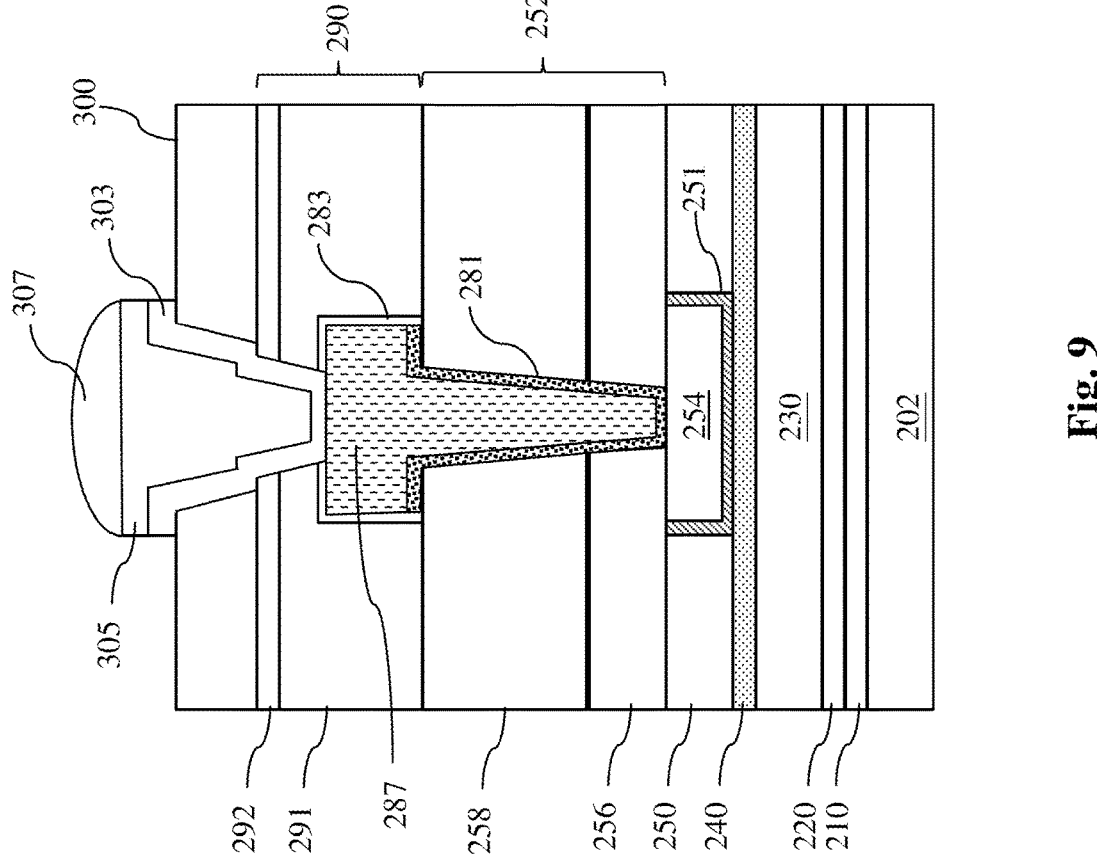
Figure 9:
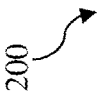

The method 100 proceeds to block 120 where a bumping process is performed. With reference to FIG. 9, in an embodiment of block 120, a bumping process includes formation of under-bump metallization (UBM) 303, a copper (Cu) pillar 305 (or Cu bump) over the UBM 303, and a solder bump 307 over the Cu pillar 305. In some embodiments, the UBM 303 provides a low resistance electrical connection to the RDL within the upper portion of the upper contact feature 287. The UBM 303 also hermetically seals and prevents diffusion of other bump metals into the device 200. In various examples, the UBM 303 includes multiple layers of different metals such as an adhesion layer (e.g., Ti, Cr. Al or a combination thereof), a diffusion barrier layer (e.g., CrCu alloy), a solderable layer, and an oxidation barrier layer (e.g., Au). The various layers of the UBM 303 may be deposited by electroplating, sputtering, evaporation, or other suitable method. In some embodiments, a Cu seed layer may be deposited prior to formation of the Cu pillar 305, which may be formed by an electroplating process. In addition, and in some cases, a diffusion barrier (e.g., such as Ni) may be formed between the Cu pillar 305 and the solder bump 307, to prevent formation of an intermetallic layer and/or to prevent the formation of microvoids. After formation of the Cu pillar 305, a plating process may be used to form the solder bump 307 over the Cu pillar 305. One or more patterning processes (e.g., lithography and/or etching processes) may be performed to pattern one or more of the layers deposited during the bumping process. In some embodiments, a reflow process may also be performed after solder deposition to form the solder bump 307. By way of example, formation of the UBM 303, the Cu pillar 305, and the solder bump 307 provide contact structures for connection to external circuitry. In some existing implementations where the PI layer is formed over the corners 312, stress and the potential for cracking of the PI layer is maximized during the bumping process. However, in accordance with the various embodiments disclosed herein, such stress and potential cracks in the PI layer 300 are avoided by ensuring that there is no overlap of the patterned PI layer 300 over the corners 312. Thus, the reliability of the patterned PI layer 300 is enhanced.

The various embodiments described herein thus offer several advantages over the existing art. It will be understood that not all advantages have been necessarily discussed herein, no particular advantage is required for all embodiments, and other embodiments may offer different advantages. As one example, embodiments discussed herein include methods and structures for enhancing the reliability of a patterned PI layer formed over one or more passivation layers as part of a BEOL process. The disclosed embodiments also provide a simplified process for forming the patterned PI layer at a reduced cost (e.g., by reducing the number of masks used for device processing). In particular, in various embodiments, the patterning of the PI layer and the underlying passivation layer (e.g., to form a via that exposes a surface of an upper contact feature) may be performed using a single photolithography step (e.g., a single mask). Moreover, in contrast to existing implementations, no portion of the PI layer will remain within the via formed in the underlying passivation layer, or at corners of the via opening. As a result, stress at corner interfaces between the passivation layer and the PI layer, as well as any potential cracks in the PI layer resulting therefrom, can be avoided. Additional benefits and/or other advantages will become apparent to those skilled in the art having benefit of the present disclosure.

Thus, one of the embodiments of the present disclosure described a method including depositing a passivation layer over an upper contact feature. In some embodiments, the method further includes forming a polyimide (PI) layer over the passivation layer. In various examples, the method further includes patterning the PI layer to form a patterned PI layer including a first opening that exposes a portion of the passivation layer over the upper contact feature. In an embodiment, the method further includes performing one or more etching processes to form a second opening that exposes a top surface of the upper contact feature. In some embodiments, the one or more etching processes etches the passivation layer through the first opening to form a patterned passivation layer. In some examples, the one or more etching processes also recesses sidewall surfaces of the patterned PI layer from corners of the patterned passivation layer defined along opposing surfaces of the second opening.

In another of the embodiments, discussed is a method including forming a contact pad electrically coupled to an underlying multi-layer interconnect (MLI) structure by a contact via. In some embodiment, the method further includes depositing an oxide layer over the contact pad, a nitride layer over the oxide layer, and a polyimide (PI) layer over the nitride layer. In some examples, the method further includes forming a via opening that penetrates through the PI layer, the nitride layer, and the oxide layer and exposes a top surface of the contact pad. In some embodiments, the via opening includes an upper portion having a first width and a lower portion having a second width less than the first width.

In yet another of the embodiments, discussed is a device including a patterned passivation layer disposed over a contact pad. In some embodiments, the device further includes a patterned polyimide (PI) layer disposed over the patterned passivation layer. In an example, the patterned passivation layer defines a lower portion of a via opening that penetrates through the patterned PI layer and the patterned passivation layer. In some cases, the patterned PI layer defines an upper portion of the via opening. In some embodiments, the device further includes a metal layer formed within the via opening and in contact with a top surface of the contact pad. In various examples, the upper portion of the via opening has a first width, and the lower portion of the via opening has a second width less than the first width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
depositing a passivation layer over an upper contact feature;
forming a polyimide (PI) layer over the passivation layer;
patterning the PI layer to form a patterned PI layer including a first opening that exposes a portion of the passivation layer over the upper contact feature; and
performing one or more etching processes to form a second opening that exposes a top surface of the upper contact feature, wherein the one or more etching processes etches the passivation layer through the first opening to form a patterned passivation layer, and wherein the one or more etching processes recesses sidewall surfaces of the patterned PI layer from corners of the patterned passivation layer defined along opposing surfaces of the second opening.

2. The method of claim 1, wherein the second opening defines a via opening including an upper portion defined by the patterned PI layer having the recessed sidewall surfaces and a lower portion defined by the patterned passivation layer.

3. The method of claim 2, wherein a top width 'W1' of the upper portion is greater than a bottom width 'W2' of the upper portion, wherein a top width 'W3' of the lower portion is greater than a bottom width 'W4' of the lower portion, and wherein the bottom width 'W2' of the upper portion is greater than the top width 'W3' of the lower portion.

4. The method of claim 2, wherein the lower portion of the via opening is free of a material used to form the PI layer.

5. The method of claim 1, wherein the one or more etching processes recesses the sidewall surfaces of the patterned PI layer from corners of the patterned passivation layer by a distance greater than about 600 nm.

6. The method of claim 2, wherein the via opening includes a jog pattern defined along the opposing surfaces of the second opening.

7. The method of claim 2, wherein a first width of the upper portion of the via opening is greater than a second width of the lower portion of the via opening.

8. The method of claim 1, wherein the depositing the passivation layer further comprises:
depositing a barrier layer over the upper contact feature;
depositing an oxide layer over the barrier layer; and
depositing a nitrogen-containing layer over the oxide layer.

9. The method of claim 1, wherein the one or more etching processes simultaneously etches the passivation layer through the first opening and recesses the sidewall surfaces of the patterned PI layer.

10. The method of claim 1, wherein the performing the one or more etching processes includes sequentially performing a dry etching process and a wet etching process, wherein the dry etching process etches the passivation layer through the first opening, and wherein the wet etching process recesses the sidewall surfaces of the patterned PI layer.

11. The method of claim 1, further comprising:
after forming the second opening, performing a bumping process to form contact structures within the second opening.

12. A method, comprising:
forming a contact pad electrically coupled to an underlying multi-layer interconnect (MLI) structure by a contact via;
depositing an oxide layer over the contact pad, a nitride layer over the oxide layer, and a polyimide (PI) layer over the nitride layer; and
forming a via opening that penetrates through the PI layer, the nitride layer, and the oxide layer and exposes a top surface of the contact pad;
wherein the forming the via opening includes patterning the PI layer to expose sidewalls of the PI layer and a portion of the nitride layer, and after patterning the PI layer, etching through the nitride layer and the oxide layer to expose sidewalls of the nitride layer, sidewalls of the oxide layer, and the top surface of the contact pad while simultaneously laterally etching the exposed sidewalls of the PI layer to recess the sidewalls of the PI layer from the sidewalls of the nitride layer and expose corners of the etched nitride layer; and wherein the via opening includes an upper portion having a first width and a lower portion having a second width less than the first width.

13. The method of claim 12, wherein the upper portion and the lower portion collectively define a jog pattern along sidewall surfaces of the via opening.

14. The method of claim 13, wherein the jog pattern has a width that is greater than about 600 nm.

15. The method of claim 12, wherein the upper portion includes the PI layer, wherein the lower portion includes the nitride layer and the oxide layer, and wherein the corners are defined along the exposed sidewalls of the etched nitride layer.

16. The method of claim 12, wherein the lower portion of the via opening is free of a material used to deposit the PI layer.

17. The method of claim 12, further comprising:

after forming the via opening, performing a bumping process to form contact structures within the via opening.

18. A device, comprising:

a patterned passivation layer disposed over a contact pad;

a patterned polyimide (PI) layer disposed over the patterned passivation layer, wherein the patterned passivation layer defines a lower portion of a via opening that penetrates through the patterned PI layer and the patterned passivation layer, and wherein the patterned PI layer defines an upper portion of the via opening; and a metal layer formed within the via opening and in contact with a top surface of the contact pad;

wherein a bottommost part of a first sidewall surface of the upper portion of the via opening is recessed from corners defined at a topmost part of a second sidewall surface of the lower portion of the via opening; and wherein the upper portion of the via opening has a first width that tapers, wherein the lower portion of the via opening has a second width that tapers, and wherein the first width at the bottommost part of the upper portion is greater than the second width at the topmost part of the lower portion.

19. The device of claim 18, wherein the contact pad is electrically coupled to an underlying multi-layer interconnect (MLI) structure by a contact via.

20. The device of claim 18, wherein the first sidewall surface of the upper portion of the via opening and the second sidewall surface of the lower portion of the via opening collectively define a contiguous sidewall surface of the via opening having a jog pattern.

* * * * *